United States Patent

Mattson et al.

[11] Patent Number: 5,877,042
[45] Date of Patent: Mar. 2, 1999

[54] GLASS/METAL PACKAGE AND METHOD FOR PRODUCING THE SAME

[75] Inventors: John E. Mattson, Palatine, Ill.; William G. Skoda, Oak Park, Ill.; Piyush Chaudhari, Palatine, Ill.; Joyce K. Yamamoto; Ross A. Miesem, both of Albuquerque, N. Mex.

[73] Assignee: Motorola, Inc., Schaumburg, Ill.

[21] Appl. No.: 697,712

[22] Filed: Aug. 28, 1996

[51] Int. Cl.⁶ .................................................. H01L 21/44
[52] U.S. Cl. ........................ 438/123; 438/121; 438/125
[58] Field of Search ................................... 438/112, 121, 438/122, 123, 124, 125, 126; 257/704, 676

[56] References Cited

U.S. PATENT DOCUMENTS

| | | | |
|---|---|---|---|
| 5,120,678 | 6/1992 | Moore et al. ............................. | 438/125 |
| 5,168,344 | 12/1992 | Ehlert et al. ............................. | 257/704 |
| 5,217,922 | 6/1993 | Akasaki et al. ............................ | 29/840 |
| 5,219,794 | 6/1993 | Satoh et al. ............................. | 438/126 |
| 5,431,718 | 7/1995 | Lombard et al. . | |
| 5,598,031 | 1/1997 | Groover et al. ........................ | 257/676 |
| 5,744,752 | 4/1998 | McHerron et al. ..................... | 257/704 |
| 5,750,926 | 5/1998 | Scholman et al. ..................... | 257/704 |
| 5,756,380 | 5/1998 | Berg et al. .............................. | 438/126 |

*Primary Examiner*—Kevin M. Picardat
*Attorney, Agent, or Firm*—Brian M. Mancini; Gary J. Cunningham

[57] ABSTRACT

A method of producing a glass/metal package where a glass portion of the package is built up around a provided leadframe (10) using applications of solderable and glass pastes (20) which are subsequently fired (30). The glass paste and leadframe are chosen to have similar coefficients of expansion and the leadframe is pretreated to degasify and control oxidation of the metal to promote glass adhesion to the leadframe and prevent microcracking at a glass/metal interface. A seal ring is applied to the glass paste (40) and a lid is attached to the seal ring (50). The package is used to provide an sealed inert internal environment for sensitive electronic components such as a piezoelectric element. The package may be configured for leaded or surface mounting (60).

14 Claims, 4 Drawing Sheets

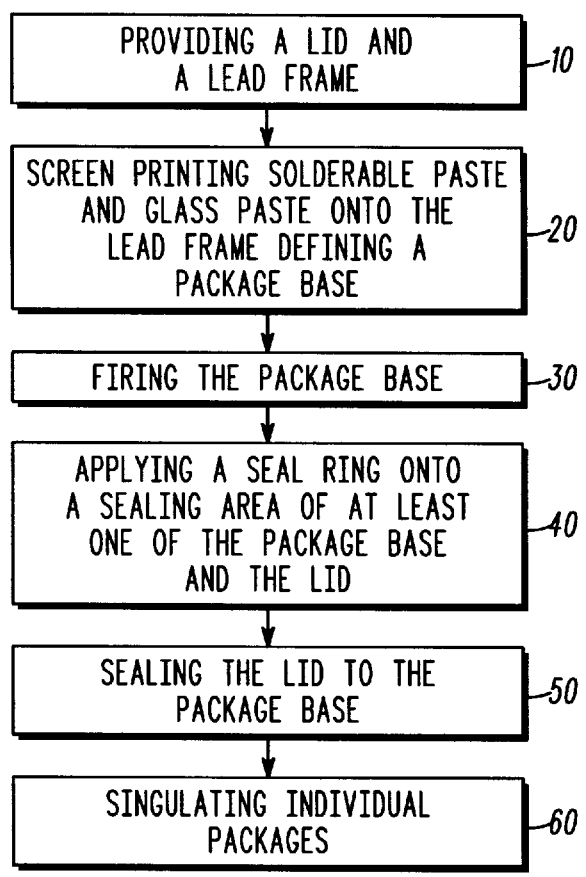

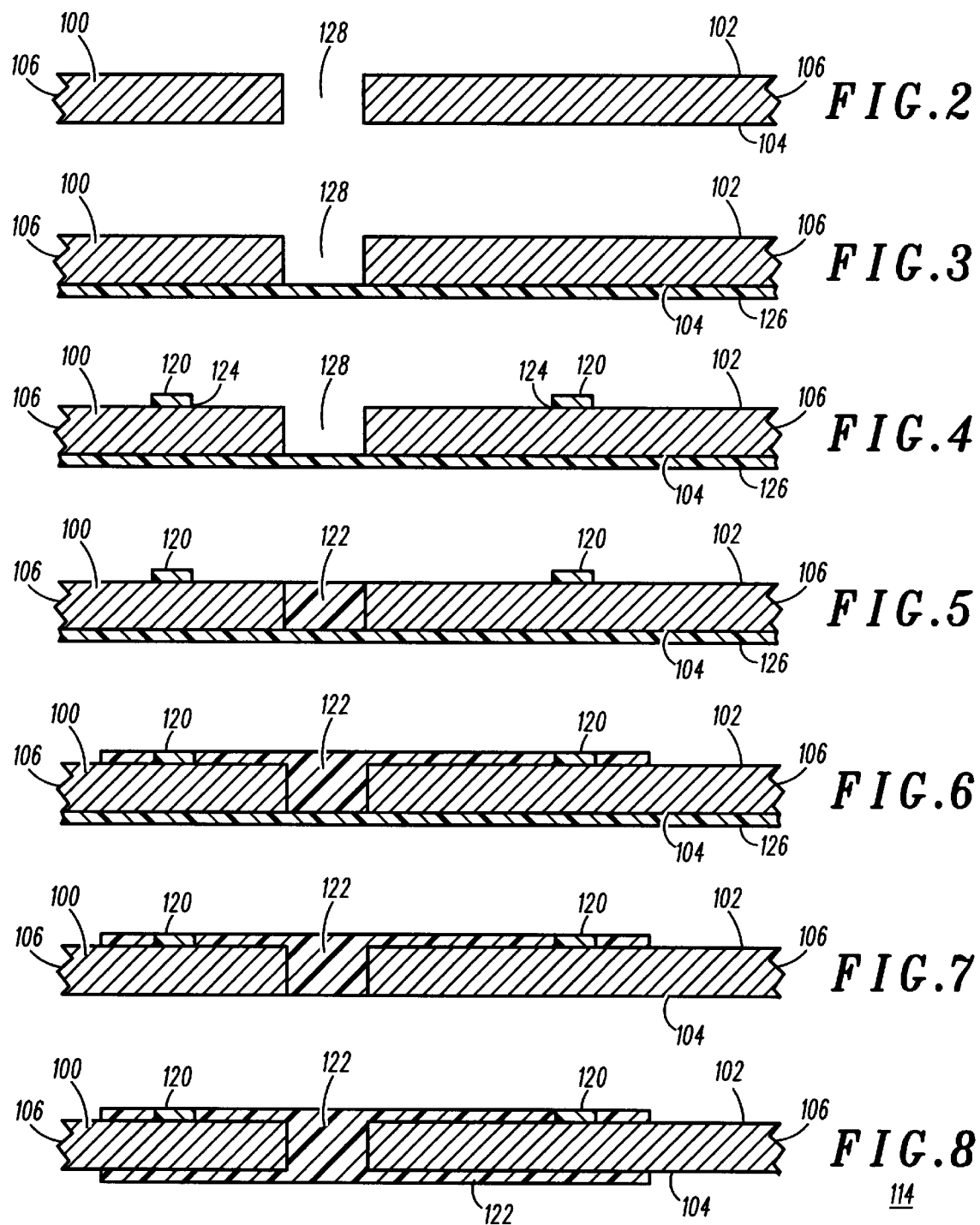

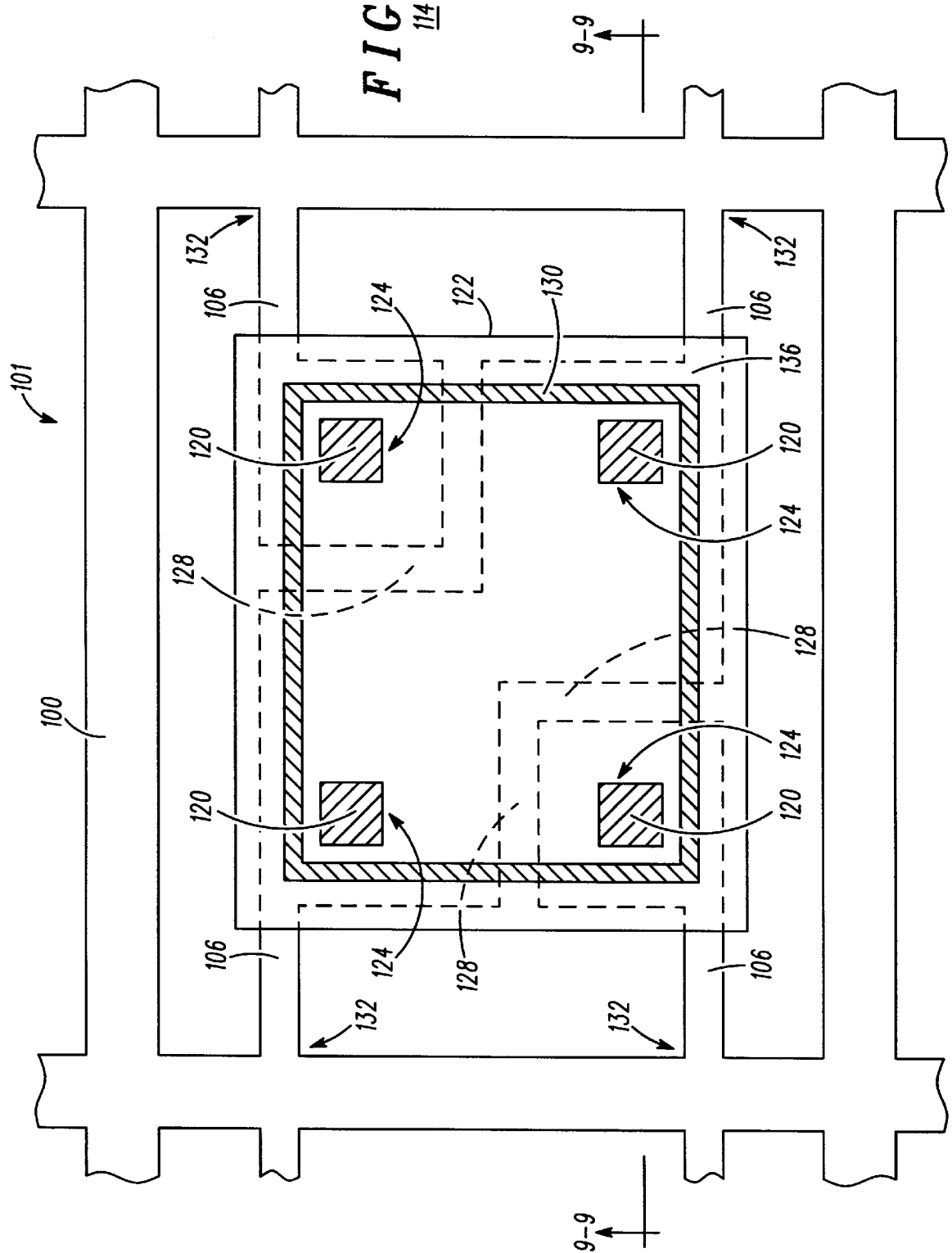

5,877,042

GLASS/METAL PACKAGE AND METHOD FOR PRODUCING THE SAME

FIELD OF THE INVENTION

The present invention relates generally to packaging for electronic devices. In particular, the present invention concerns a glass/metal package and method for producing the same.

BACKGROUND OF THE INVENTION

Sensitive electronic devices, such as piezoelectric devices typically require mounting in a hollow cavity within a ceramic/metal package. Such a package may include a ceramic/metal base or substrate being sealed with a lid, can, or shield. A common problem for sensitive electronic devices such as piezoelectric devices is providing an inert environment within the package. Another common problem is providing metal leads through a sealed ceramic package to connect with the internal device, and providing these leads and sealing the package while effectively preventing leaks due to thermal or mechanical stresses.

It is often the case where the ceramic and metal materials making up a packaging device have different coefficients of thermal expansion. This mismatch induces mechanical stresses as the part is exposed to different temperatures which occasionally results in leaks due to microcracking of the ceramic. In addition, external mechanical stresses may also contribute to microcracking.

Two main packaging schemes have been used for mounting piezoelectric devices. In a first scheme a piezoelectric element is suspended by a plurality of metal leads which extend through a glass plug in a substantially metal container. Although reliable, these packages, are not easily integrated into automated assembly production lines. In a second scheme a piezoelectric element is adhesively mounted to metal traces extending through a ceramic base. The base is subsequently sealed with a ceramic or metal lid by means of a metal or glass seal. Although this type of package is readily automatable, the ceramic base is expensive due to the multiple layers of preformed ceramic green sheet, and the many processing steps, typically needed to produce such a base.

A significant portion of the cost of a piezoelectric device is in its packaging. Previously, the packaging used for piezoelectric devices was typically ceramic packaging which has demonstrated good production yields. However, the ceramic structures themselves, though effective, are complicated and have a high inherent manufacturing cost. Cost reduction can be achieved if the packaging for piezoelectric devices can be simplified to allow ease of handling and automation.

There is a need for an improved package that: is low cost; minimizes the number of processing steps and separate packaging components; is robust under automation processes; is robust under mechanical shocks and environmental testing; and minimizes problems from differing thermal expansion coefficients between ceramic and metal packaging materials.

Accordingly, a robust, low cost, automatable, easily manufacturable package for a piezoelectric device which substantially eliminates leaks due to thermal stress cracks between a ceramic (or glass)/metal interface would be considered an improvement over the art.

BRIEF DESCRIPTION OF THE DRAWINGS

FIG. 1 shows a flow chart for a method for producing a low cost glass/metal package, in accordance with the present invention;

FIGS. 2–12 show various stages in the connection with the method for producing a low cost glass/metal package, in accordance with the present invention;

FIG. 2 shows a cross sectional view of a provided leadframe, in accordance with the present invention;

FIG. 3 shows a cross sectional view of the leadframe after application of an adhesive backing, in accordance with the present invention;

FIG. 4 shows a cross sectional view of the leadframe after application of a solderable paste at a plurality of electrical connection locations, in accordance with the present invention;

FIG. 5 shows a cross sectional view of the leadframe after application of a glass paste within a gap of the leadframe, in accordance with the present invention;

FIG. 6 shows a cross sectional view of the leadframe after application of a glass paste to a top side of the leadframe, in accordance with the present invention;

FIG. 7 shows a cross sectional view of the leadframe after removal of the backing, in accordance with the present invention;

FIG. 8 shows a cross sectional view of the leadframe after application of a glass paste to a bottom of the leadframe defining a package base, in accordance with the present invention;

FIG. 9 shows a cross sectional view of the package base after application of a seal ring, in accordance with the present invention;

FIG. 10 shows a cross sectional view of the package base after mounting of a sensitive electronic component, in accordance with the present invention;

FIG. 11 shows a cross sectional view of a package after being sealed with a lid, in accordance with the present invention;

FIG. 12 shows a cross sectional view of the package after singulation and lead forming, in accordance with the present invention; and FIG. 13 shows a top view of the package base before being sealed with the lid, in accordance with the present invention.

DETAILED DESCRIPTION OF THE PREFERRED EMBODIMENT

Figure 9:
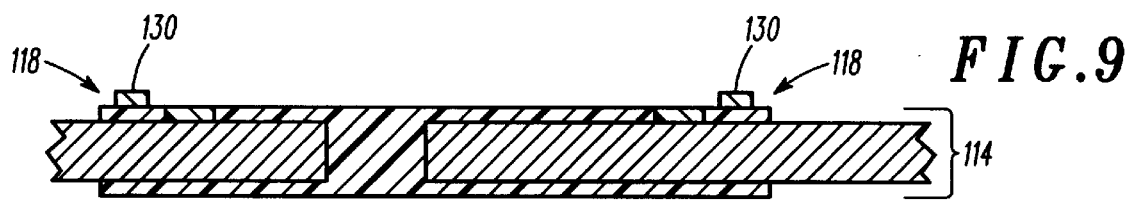

FIG. 1 shows a flowchart for producing a low cost metal/glass package that is constructed substantially from glass paste, a leadframe, and a lid. It is to be understood that the terms "glass" and "glass paste" used in the present invention include traditional glasses, ceramics, glass/ceramic composites and metal/glass composites. It is also to be understood that the term "solderable paste" refers to glass pastes which, after firing can be soldered to, such as silver, and silver/palladium containing glass pastes.

The advantage of the present invention is that it combines two known technologies, metal stamping and glass screen printing, in a new and surprising way. The present invention defines a process for combining these two technologies without the high costs that are typically present in ceramic/metal processing and the microcracking and subsequent leaking that typically occurs at a glass/metal interface. Also, the present invention advantageously substantially prevents leaks in sensitive electronic packaging such as that needed for a piezoelectric element.

Referring to FIGS. 1 and 2, a first major process step 10 in the present invention is providing a leadframe 100 and a formed lid (not shown). The leadframe 100 can be stamped or etched from a metal sheet. In order to be compatible with, and be a replacement for, prior art applications this package must substantially match the coefficient of thermal expansion of alumina. Therefore, in a preferred embodiment, the leadframe 100 is selected from one of Alloy 42, Alloy 47 (47% Ni/51% Fe) or Kovar™ sheet, and is stamped in an array of package cells 101, substantially as shown in FIG. 13, for example. The advantage of using one of the above alloys is that their coefficients of thermal expansion closely match that of alumina. In a preferred embodiment, Alloy 47 is used. Alloy 47 has the advantage of having a coefficient of thermal expansion that substantially matches that of glass or alumina (about 7 to 8 ppm/°C.). The advantage of stamping is that it is typically cheaper than etching, and the stamping in an array arrangement allows automation and parallel processing to increase factory production throughput and lower costs.

The leadframe 100 has a top side 102 and a bottom side 104 and is stamped or etched to provide a plurality of leads 106 connected to and extending from the leadframe 100 into the package cell 101 (as shown in FIG. 13). In one embodiment, a 0.08 to 0.3 mm thick leadframe is used. Also, in a preferred embodiment, the leadframe is pretreated in a reducing atmosphere for at least ten minutes at a temperature at least as high as any temperature it will be exposed to in subsequent processing. In particular, a 0.15 mm leadframe is pretreated at temperature of about 620° C. for about 1 hour in a reducing (5% $H_2$/95% $N_2$) atmosphere. The pretreatment has the advantage of substantially reducing gas evolution from the metal (degassing) and resultant bubble formation in overlying glass paste during subsequent processing. Additionally, the pretreatment controls the oxide layer at the glass/metal interface to prevent an excess of oxide formation so as to maximize adhesion between the glass and metal. It should be noted that is not necessary that the oxide layer be completely removed.

Figure 11:
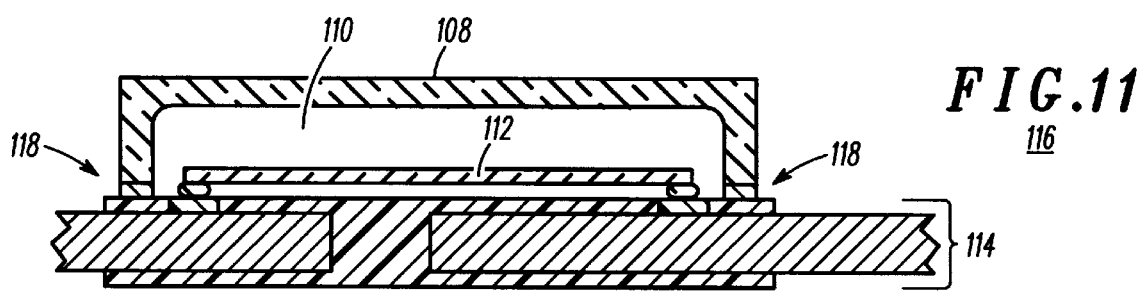
Figure 12:
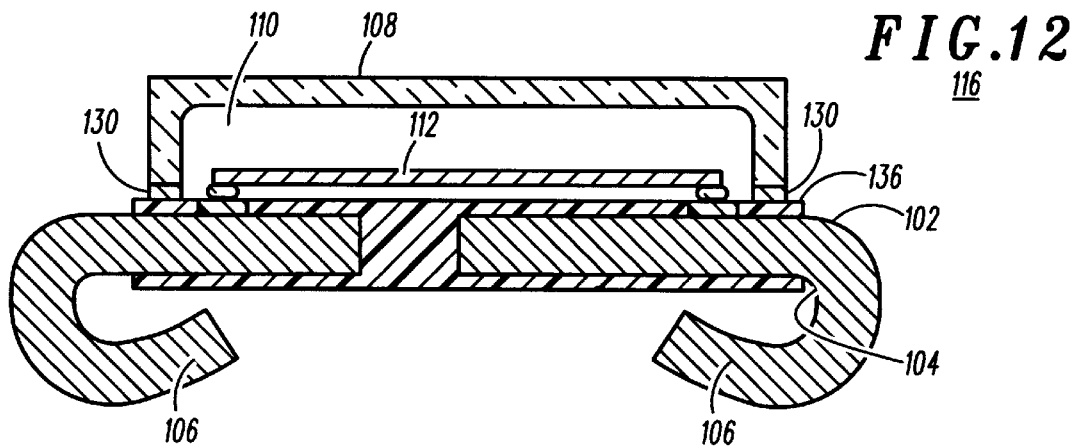

As shown in FIGS. 11 and 12, the formed lid 108 includes a cavity and is shaped like an inverted bathtub. The lid 108, when sealed with a package base 114, forms a package 116 with a hollow interior 110 which can encompass a sensitive electronic component 112 such as a piezoelectric element and can provide a controlled environment for the component 112. The lid 108 may be of at least one of a metal, glass or a ceramic. The process used to seal the package determines the composition of the lid 108. In a preferred embodiment, the lid 108 has a similar coefficient of thermal expansion as other materials used in the package 116. In particular, a metal lid is preferred for seam weld, resistance weld, and solder seal processes. Further, a metal lid may use an attached solder preform on a sealing area 118 to promote sealing. A glass or ceramic lid is preferred for glass frit, and epoxy seal processes, and can also be used in solder seal processes. Further, the glass or ceramic lid may be precoated in a sealing area 118 with either glass frit, epoxy, or solder to promote sealing. In a more preferred embodiment, an alumina lid is used in a glass frit sealing process.

Referring to FIGS. 1 and 3–8, a second major process step 20 in the present invention is screen printing a solderable paste 120 and a glass paste 122 on the leadframe 100 defining a package base 114. The solderable paste 120 is applied to a plurality of electrical connection locations 124 on the leadframe 100 where electrical connections will be made. The glass paste 122 is applied to cover a portion of the leadframe 100 leaving substantially only the solderable paste 120 exposed for internal electrical connections and leaving the plurality of leads 106 exposed for external electrical connections. The locations 124 on the top side 102 of the leadframe 100 are for subsequently electrically connecting to an electronic component to be packaged. Further, optional locations (not shown) on the bottom side of the leadframe may be screen printed with the solderable paste if it is desired that the package be surface mountable. In one embodiment, the solderable paste 120 is silver paste. In a preferred embodiment, the solderable paste 120 is #6118 silver paste from Premetek, Inc. of State College, Pa.

In a preferred embodiment, the glass paste 122 is mixed separately to achieve a predetermined viscosity. Glass powder is milled to a 1 µm particle size, and dispersed in a thick film organic vehicle paste. In one embodiment, the glass powder used is #FX-11-096, obtained from Ferro, Electronic Materials Division of Santa Barbara, Calif. The organic vehicle paste is fully described in U.S. Pat. No. 5,431,718 issued to Lombard et al. which is hereby incorporated by reference. In a preferred embodiment, the glass paste has a solids loading of greater than 90%, a viscosity of about 22270 cPs at room temperature and a shear rate of about 96 reciprocal seconds. Advantageously, the use of the foregoing pastes exhibited the best printability, gap filling, surface smoothness and minimal chemical reaction.

It is important that the application of the solderable and glass paste 120,122 is controlled so as to prevent flashing of the paste from the top side 102 to the bottom side 104 of the leadframe 100. Therefore, in a preferred embodiment, an adhesive backing 126 (shown in FIGS. 3–6) is used on the bottom side 104 of the leadframe 100 when screen printing the top side 102 of the leadframe 100. Thermal release backing tape is available through Micro Packaging, Inc. of Conway, S.C. The adhesive backing 126 advantageously provides support to the leadframe 100 and substantially eliminates flashing when gaps 128 of the leadframe 100 are being filled with the glass paste 122.

In a preferred embodiment, the screen printing step 20 includes several intermediate steps. First, as shown in FIG. 3, the adhesive backing 126 is affixed to the bottom side 104 of the leadframe 100. Next, as shown in FIG. 4, a solderable paste 120 is applied to electrical connection locations 124 on a top side 102 of the leadframe 100 and dried. In particular, the paste is dried at a high enough temperature to remove the volatile organics in the paste, or at about 60° C. for greater than about ten minutes. Next, as shown in FIGS. 4 and 5, the gaps 128 in the leadframe 100 are filled by screen printing with the glass paste 122. In particular, a 0.15 mm thick screen or stencil is used for this screening. Next, as shown in FIG. 6, the top side 102 of the leadframe 100 along with the previously glass paste filled gaps are screen printed with more glass paste 122 leaving the previously applied solderable paste 120 exposed. In particular, a 0.10 mm thick screen or stencil is used for this screening. Next, the printed pastes 120,122 are dried, as above. Next, as shown in FIG. 7, the adhesive backing 126 is removed from the leadframe 100. If thermal release backing is being used it is removed by heating the leadframe 100 to about 120° C. to cleanly separate the backing 126. At this point, an optional second application of solderable paste may be applied to locations on the bottom side of the leadframe for electrical connections needed in surface mounting (not shown). Next, as shown in FIG. 8, the bottom side 104 of the leadframe 100 and the previously glass paste filled gaps are screen printed with more glass paste 122 leaving any applied solderable paste on the bottom side 104 of the leadframe 100 exposed. In particular, a 0.10 mm thick screen or stencil is used for this screening. Next, the glass paste 122 is dried, as above. The glass paste 122 surrounds a central portion of the leadframe 100 leaving only the dried solderable paste 120 and the leads 106 exposed defining a package base 114. In a preferred embodiment, the foregoing intermediate steps are repeated to build up the thickness of the glass paste to improve rigidity and planarity.

In one embodiment, the solderable paste is of a lower height than the surrounding glass paste. For this embodiment, a subsequent electrical connection to the solderable paste is made by dispensing conductive material or by reflowing solder on top of the solderable paste (not shown) to build up the height of the solderable paste, followed by making an electrical connection by any of the commonly known techniques known in the art. In another embodiment, the solderable paste is equal to or higher than the surrounding glass paste. For this embodiment, an electrical connection to the solderable paste can be made by any of the commonly known techniques known in the art (not shown).

Referring to FIG. 1, a third major process step 30 in the present invention is firing the pastes. Because the manufacturer's intended use of the pastes is different from that of the present invention, the firing profile used is different from the manufacturer's recommended firing profile. For the process as tested, a box furnace with a programmable controller, which is known in the art, was used for firing the package base. Preferably, a belt furnace, which is also known in the art, should be used for firing the package base due to its inherently better control of temperature profile. In particular, the firing profile includes an organics burnout stage at about 350±10° C. for about 90 minutes, a peak temperature stage of about 600±5° C. for about 3 to 18 minutes, an anneal stage at about 535±10° C. for about 20 to 30 minutes, and a cooling stage back to room temperature.

Referring to FIGS. 1 and 9, a fourth major process step 40 is applying a seal ring 130 onto the package base 114. In a first embodiment, where the package base 114 will be solder sealed to the lid, a solder-wettable material is applied to a sealing area 118 of the package base 114 and the lid. Preferably, the seal ring 130 is a solderable paste. In particular, the solderable paste is silver paste which is screen printed and fired on the package base 114. Because the package base 114 is fired at about 615°–620° C. in a preferred embodiment, the seal ring 130 must be fired at a temperature lower than this to avoid damaging the package base 114. Two pastes manufactured by Ferro, #3350 and #33-246, were identified and found to fire at about 400° C. without substantial reaction with the package base 114. Solder is subsequently applied to the fired seal ring 130 in a standard solder dip or reflow process which is known in the art (not shown). Also, ceramic and metal lids with preattached solder in the sealing areas are well known in the art and are readily available.

In a second and preferred embodiment, where the package base 114 is sealed to the lid with glass frit, a low temperature glass frit seal ring 130 is applied onto a sealing area 118 of the package base 114, the lid, or both. The lid is placed onto the package base 114 and a nominal pressure in applied. The lid and package base 114 are then heated until the glass frit completely reflows sealing the package. Preferably, this occurs when the package is heated to about 330° C. for about 10 minutes.

In a third embodiment, where the package base 114 will be sealed by resistance or seam welding to a lid, a seal ring 130 of a preformed metal (such as Alloy 47) is attached onto the package base 114. In particular, attaching the seal ring 130 may be done by a high temperature solder or a low temperature braze (temperatures below about 615°–620° C.). Soldering and brazing a metal ring to a ceramic package are techniques that are well known in the art. Typically, a metal lid is used for resistance or seam welding. These lids are well known in the art and are readily available. However, it should be recognized that the use of resistance or seam welding will add to the cost of the package significantly, due to the addition of an extra-cost preformed seal ring and many additional process steps.

In a fourth embodiment, where the package base 114 will be sealed to the lid with epoxy, an epoxy seal ring 130 is applied to the package base 114, the lid, or both. Epoxy sealing is well known in the art and is readily available from companies such as DuPont. However, it should be recognized that, in general, epoxy does not provide hermetic sealing. Therefore, epoxy should only be used in those situations where hermeticity is not a critical requirement.

Before or after this step 40, in a preferred embodiment, the leadframe 100 can be selectively plated to minimize corrosion, improve electrical connections inside the package and improve solderability outside the package. The leadframe 100 may be plated with a solderable metal, such as lead-tin or gold plate, to improve solderability.

Figure 10:
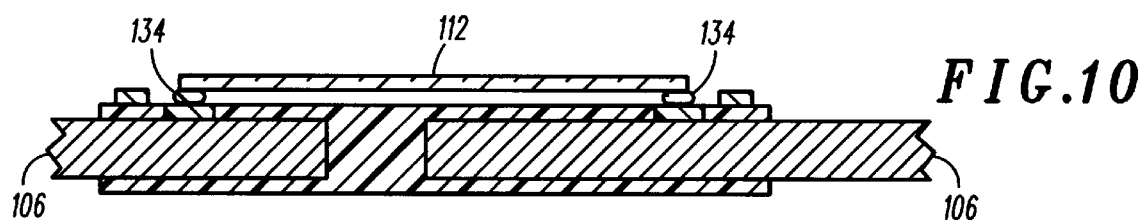

Referring to FIG. 10, after the seal ring 130 has been applied in this step 40 and before sealing the package, the electronic component 112 to be packaged is mounted with a solder, wire-bond, or conductive adhesive 134 onto the package base 114. This may be done by any of the various mounting techniques that are known in the art. Although only four electrical connections to the leads 106 are demonstrated in the present invention (shown as 120 in FIG. 13), it should be recognized that a greater or lesser number of leads 106 may be incorporated into the present invention.

Referring to FIGS. 1 and 11, a fifth major process step 50 is sealing the package base 114 with the lid 108. Preferably, the sealing process is conducted in an inert environment when connecting the lid 108 to the package base 114. In a first embodiment, where solder sealing is used, the manufacturer's recommended procedures or the standard processes that are known in the art may be used successfully. Typical sealing profiles for solder sealing are at about 320° C. for about 2 to 3 minutes. In a second and preferred embodiment, where glass frit sealing is used, the manufacturer's recommendation for sealing should be followed. In particular, where Kyocera (of Tokyo, Japan) lids were used in the present invention, the sealing action occurs at about 330±10° C. for about 10 minutes followed by a cooling off rate of less than or equal to about −40° C. per minute. In a third embodiment, where resistance welding or seam welding is being used, the manufacturer's recommended procedures or the standard processes that are known in the art may be used successfully. In a fourth embodiment, where epoxy sealing is being used, the manufacturer's recommended procedures or the standard processes that are known in the art may be used successfully. Typical sealing profiles for lids with epoxy seal rings are at about 150° C. for about 1 to 2 minutes.

As should be understood by those skilled in the art, various combinations of the above process steps and adhesives can be used to seal the lid to the package base.

Referring to FIGS. 1 and 12, a final major process step 60 is singulating the completed package 116 from the leadframe 100. This step 60 provides singulation or separation of the package 116 from the remaining unwanted portion of the leadframe 100. A preferred device used for this singulation step 60, can be a stamping tool such as one manufactured by a tool and die maker, such as Dial Tool & Mfg. Corp. of Illinois. In a preferred embodiment, singulation is performed automatically. After singulation, the packaged electronic device may be electrically tested.

In one embodiment, the leads 106 are excised near a periphery 132 of the leadframe 100 (as shown in FIG. 13) and are formed into a predetermined shape per mounting requirements. In this embodiment, the leads 106 are bent during or after the automatic singulation of the electronic device from the leadframe 100 to meet customer mounting requirements. Standard lead shapes, that are known in the art, can be achieved by the present invention. These shapes include, for example: through-hole, straight, gullwing, butt-joint, and J-shaped leads (shown in FIG. 12).

In another embodiment, the leads 106 connected to the leadframe 100 are excised substantially flush with the package base 114, the optional contact pads exposed on the bottom of the package base 114 serving to provide an external electrical connection to a now leadless, surface mountable package 116.

There are four critical parameters to consider for the glass paste in the present invention; viscosity, solids loading, firing profile, and reduction of bubbles after firing, particularly in the gap areas of the leadframe. As explained above, these items should be well controlled.

Referring to FIG. 12, a low cost glass/metal package 116 is shown. Also, a central portion of FIG. 13 represents a lower portion of the package showing the package base 114 with a connecting seal ring 130. The package 116 is comprised of a leadframe 100, fired solderable and glass pastes 120,122, a lid 108, and a seal ring 130. In a preferred embodiment, the leadframe 100 is made from Alloy 47. In this embodiment, the leadframe 100 includes a plurality of leads 106. The leadframe 100 has a fired solderable paste 120 connected to a top side 102 of the leadframe 100 at a plurality of electrical connection locations 124. A fired glass paste 122 substantially surrounds the central portion of the leadframe 100 leaving the fired solderable paste 120 and leads 106 exposed. The fired glass paste substantially fills all gaps in the central portion of the leadframe 100. A seal ring 130 is connected to a top surface 136 of the fired glass paste 122 and a lid 108 is connected to the seal ring 130. The lid 108, seal ring 130, and package base 114 define a hollow interior 110 of the package 116. An electronic component 112, such as a piezoelectric element is mounted, using adhesives known in the art, to the fired solderable paste 120 such that the component is mechanically bounded within the hollow interior 110, yet having access to external electrical connections. The component 112 is electrically connected to the external leads 106 of the leadframe 100 through the fired solderable paste 120.

Optionally, fired solderable paste may be connected to the bottom side of the leadframe and is exposed through the fired glass paste (not shown). In this option, the leads are excised substantially flush with the package base, thereby defining a surface mount package. In this configuration, an external electrical connection to the component can be made directly through the fired solderable paste to the electrical component. This option has the advantage of being a leadless surface mount package which is simpler to handle and automate.

The leads 106 are formed to meet customer mounting requirements. Standard lead shapes, that are known in the art, can be achieved by the present invention. These shapes include, for example: through-hole, straight, gullwing, butt-joint, and J-shaped leads (as shown in FIG. 12).

The seal ring 130 is composed of at least one of: glass frit, fired solderable paste coated with solder, epoxy, and a preformed metal ring welded to the package 116 by solder or brazing. In a solder embodiment, the lid 108 may be a glass, ceramic or a metal. If a glass or ceramic lid is used, a solderable interface must be fired into the lid at a sealing area of the lid. Lids with preattached solder are known in the art and are readily available. In a preferred embodiment, the seal ring is glass frit. Also, it should be recognized that packages sealed with epoxy may not be hermetic.

The advantage of the present invention comes from its combination of low cost materials, good thermal matching of materials, robustness for automated assembly, improved yield and cost savings due to assembly process simplification, and exceptionally low profile. In particular, the pastes used provide good printing characteristics with a continuous surface and even thickness, high pattern resolution and complete gap filling. The drying and firing processes for the pastes provide complete organic vehicle burn-out without charred residue in the glass. The pretreatment of the leadframe effectively eliminates the formation of bubbles in the glass, and maintains the good wetting of the leadframe surface by the molten glass which indicates low surface energy differences between the metal and the glass. The pastes used in the present invention provide controlled glass flow during firing, the glass flowing to form a smooth, defect and bubble free glass surface but not flowing through the gaps or onto the electrical contact pads. In addition, the present invention provides good adhesion between the glass/metal interface indicating good material compatibility and strong chemical bonding. Further, after firing, the leadframe retains flexibility without incurring microcracking at the glass/metal interface.

Also, it should be recognized that the present invention could be used to provide a double-sided package. That is, one where an electronic component and lid are mounted on both sides of the package base. Alternatively, a component and lid may be mounted on one side, and a component coated with potting compound mounted on the other side. Other configurations using electronic components mounted on either side, with or without protective coverings may also be realized.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A method of making a glass/metal package, comprising the steps of:

providing a lid having a cavity and a metal leadframe including an array of cells, the leadframe having top and bottom sides and a plurality of leads;

screen printing a solderable paste and a glass paste onto the leadframe, the solderable paste is applied to a plurality of electrical connection locations on the leadframe, the glass paste is applied to cover a central portion of the leadframe leaving the solderable paste and the leads exposed, the covered portion of the leadframe defining a package base;

firing the package base;

applying a seal ring onto a sealing area of at least one of the package base and the lid;

sealing the lid and the package base, the lid and base defining a sealed package; and singulating the package from the leadframe.

2. The method of claim 1, wherein after the first step, further comprising the step of pretreating the leadframe to degas the leadframe such that an oxide layer on the leadframe is controlled such that the wettability of the leadframe by the glass paste is maintained.

3. The method of claim 1, wherein the applying step includes applying at least one of the group consisting of a glass frit seal ring, a solder seal ring, an epoxy seal ring, and a preformed metal seal ring.

4. The method of claim 1, wherein the screen printing step comprises:

affixing an adhesive backing to the bottom side of the leadframe;

applying solderable paste to a plurality of electrical connection locations on the leadframe and drying the solderable paste;

filling all gaps in the leadframe with the glass paste and drying the glass paste;

applying glass paste to the top side of the leadframe leaving the solderable paste and the leads exposed and drying the glass paste;

removing the adhesive backing; and applying glass paste to the bottom side of the leadframe leaving the leads exposed and drying the glass paste.

5. The method of claim 1, wherein the screen printing step includes drying the solderable and glass pastes before the firing step.

6. The method of claim 1, wherein the screen printing step includes screen printing solderable paste on the bottom side of the leadframe, screen printing glass paste on the bottom side of the leadframe leaving the solderable paste exposed, and wherein the singulating step includes excising the leads flush with the package base, thereby defining a surface mount package.

7. The method of claim 1, wherein the singulating step includes the steps of:

excising the leads near a periphery of the leadframe; and bending and adjusting the leads of the leadframe to a shape such that the package is suitable for mounting.

8. The method of claim 7, wherein the bending and adjusting step includes forming the leads to have a shape selected from at least one of the group consisting of a straight lead, a through-hole lead, a gullwing lead, a butt-joint lead and a J-shaped lead.

9. A method of making a glass/metal package, comprising the steps of:

providing a lid having a cavity and a metal leadframe including an array of cells, the leadframe having top and bottom sides and a plurality of leads;

affixing an adhesive backing to the bottom side of the leadframe;

screen printing a solderable paste to a plurality of electrical connection locations on the leadframe and drying the solderable paste;

filling all gaps in the leadframe with a glass paste and drying the glass paste;

screen printing glass paste to the top side of the leadframe leaving the solderable paste and the leads exposed and drying the glass paste;

removing the adhesive backing;

screen printing glass paste to the bottom side of the leadframe leaving the leads exposed and drying the glass paste, the pastes and leadframe defining a package base;

firing the package base;

applying a glass frit seal ring onto a sealing area of at least one of the package base and the lid;

sealing the lid and the package base, the lid and base defining a sealed package; and singulating the package from the leadframe.

10. The method of claim 9, wherein after the first step, further comprising the step of pretreating the leadframe in a reducing atmosphere at a temperature over 600° C. for at least 10 minutes to degas the leadframe such that an oxide layer on the leadframe is controlled.

11. The method of claim 9, wherein the firing step includes an organics burnout stage at about 350±10° C. for about 90 minutes, a peak temperature stage of about 600±5° C. for about 3 to 18 minutes, an anneal stage at about 535±10° C. for about 20 to 30 minutes, and a cooling stage back to room temperature.

12. The method of claim 9, wherein the sealing step includes sealing the lid to the seal ring at a temperature of about 330° C. for about 10 minutes.

13. The method of claim 9, wherein after the removing adhesive backing step, further comprising a screen printing step including screen printing solderable paste on the bottom side of the leadframe, and wherein the screen printing glass paste on the bottom side of the leadframe step includes leaving the solderable paste exposed, and wherein the singulating step includes excising the leads flush with the package base, thereby defining a surface mount package.

14. The method of claim 9, wherein the singulating step includes the steps of:

excising the leads near a periphery of the leadframe; and bending and adjusting the leads of the leadframe to a shape selected from at least one of the group consisting of a straight lead, a through-hole lead, a gullwing lead, a butt-joint lead and a J-shaped lead.

* * * * *